United States Patent [19]
Lee

[11] Patent Number: 6,144,422
[45] Date of Patent: Nov. 7, 2000

[54] THIN FILM TRANSISTOR HAVING A VERTICAL STRUCTURE AND A METHOD OF MANUFACTURING THE SAME

[75] Inventor: Young-Keun Lee, Seongnam, Rep. of Korea

[73] Assignee: Hyundai Electronics Industries Co., Ltd., Kyoungki-do, Rep. of Korea

[21] Appl. No.: 08/996,128

[22] Filed: Dec. 22, 1997

[30] Foreign Application Priority Data

Dec. 28, 1996 [KR] Rep. of Korea ............... 96-75461

[51] Int. Cl.[7] ............... G02F 1/136; H01L 29/04
[52] U.S. Cl. ............... 349/43; 349/42; 257/59; 257/72
[58] Field of Search ............... 349/42, 43, 44; 257/59, 57, 60, 72, 347, 349, 352, 353

[56] References Cited

U.S. PATENT DOCUMENTS

| | | | |
|---|---|---|---|
| 4,830,468 | 5/1989 | Stephany et al. | 350/336 |
| 4,916,510 | 4/1990 | Sano et al. | 257/59 |
| 4,924,279 | 5/1990 | Shimbo | 257/59 |
| 5,055,899 | 10/1991 | Wakai et al. | 257/59 |
| 5,060,036 | 10/1991 | Choi | 257/72 |
| 5,159,476 | 10/1992 | Hayashi | 359/54 |
| 5,306,653 | 4/1994 | Hur | 437/40 |
| 5,336,930 | 8/1994 | Quach | 257/774 |
| 5,397,721 | 3/1995 | Hur | 437/40 |
| 5,440,189 | 8/1995 | Nakahata et al. | 310/313 |
| 5,555,112 | 9/1996 | Oritsuki et al. | 257/72 |
| 5,598,012 | 1/1997 | Hebiguchi | 257/59 |
| 5,610,737 | 3/1997 | Akiyama et al. | 349/47 |
| 5,930,607 | 7/1999 | Satou | 349/40 |

FOREIGN PATENT DOCUMENTS 58-098975A 6/1983 Japan .
63293881A 6/1983 Japan .

*Primary Examiner*—William L. Sikes
*Assistant Examiner*—Dung Nguyen

[57] ABSTRACT

Disclosed herein is a thin film transistor for a liquid crystal display device comprising: a substrate; a source(drain) electrode formed on the substrate, with a first width; a semiconductor layer formed on the source(drain) electrode having a second width, the second width being narrower than the first width; an insulating layer formed on the entire surface of the resultant surface structure in which the semiconductor layer is formed, having a contact hole for exposing one portion of the semiconductor layer; the drain(source) electrode formed on a portion of a surface of the insulating layer, filling the contact hole; and a gate electrode formed on the other portion of the insulating layer, separated from the second electrode with a selected distance.

32 Claims, 3 Drawing Sheets

THIN FILM TRANSISTOR HAVING A VERTICAL STRUCTURE AND A METHOD OF MANUFACTURING THE SAME

BACKGROUND OF THE INVENTION

1. Field of the Invention

The present invention relates to a technology of a thin film transistor for a liquid crystal display(LCD) device, and particularly to a thin film transistor having a vertical structure and a method of fabricating the same.

2. Description of the Related Art

Generally, a liquid crystal display device is used in a television, a graphic display, etc. Particularly, an active matrix type liquid crystal device has a high-speed response property and is suitable for a display device for which a plurality of pixels are required. Therefore, it contributes to realizing a large-scale picture with high definition. Furthermore, it is applied to a lap-top computer, a portable television set, a car navigation displays(cockpit), etc., owing to a light-weighting and a low power consumption.

In such an active matrix type liquid crystal device, at the intersecting portions of a number of gate bus lines and date bus lines, a number of switching devices such as diodes, thin film transistors, etc. are arranged in order to selectively drive the pixel electrodes.

A thin film transistor includes a staggered transistor, an inversely staggered transistor, a planar type transistor and an inversely planar type transistor. In FIG. 1, the inversely staggered type thin film transistor is shown.

Referring to FIG. 1, a metal material such as chromium or aluminum, etc. is deposited to a selected thickness on the surface of a lower insulating substrate 1 and is patterned using a first mask to form a gate electrode 2 of a thin film transistor.

To make insulation with a conductive layer to be formed in later step, an insulating layer 3 made of a material such as silicon nitride is coated on the entire surface of the resultant surface in which the gate electrode 2 is formed. Then, on the surface of the insulating layer 3 is formed an amorphous silicon layer 4. The amorphous silicon layer 4 such as a-Si:H serves as a channel of a thin film transistor. An insulating material is deposited on a top surface of the amorphous silicon layer 4 and is patterned using a second mask to form an etch stopper 5. An amorphous silicon layer 6 such as N+ a-Si:H within which n-type impurity has been doped is formed on the surface of the resultant surface, wherein the amorphous silicon layer 6 serves as an ohmic layer. The amorphous silicon layers 6 and 4 are then patterned using a third mask. In this regard, the amorphous silicon layer 4 is patterned o as to obtain a minimum effective channel length such that the width of the amorphous silicon layer 4 is longer than the width of the gate electrode 2. Successively, a transparent material such as indium tin oxide is deposited on the entire surface of the resultant surface and is patterned using a fourth mask to form a pixel electrode 7. Following the formation of the pixel electrode 7, a conductive material such as aluminum, tantalum, chromium, etc. is deposited to a selected thickness on the resultant surface and is patterned using a fifth mask and a sixth mask so as to expose to a part of the etch stopper 5, forming a source 8a and a drain 8b of the thin film transistor separated from the source by a hole. At this time, the source electrode 8b is connected to the pixel electrode 7. Then, a passivation film is formed on the surface of the resultant surface in which the thin film transistor is formed according to the conventional method and is then patterned using a seventh mask to form a passivation film 9 remaining on the top surface only of the thin film transistor.

The inversely staggered type thin film transistor having the etch stopper as described above has the following drawbacks:

Firstly, to form the thin film transistor as shown in FIG. 1, seven masks (in the case that includes the step for the formation of the pad such as chromium, etc., eight masks are required) are required and the process is thus complicated.

Secondly, the amorphous silicon layer 4 which serves as the channel of the thin film transistor absorbs the incident light from a backlight unit of the lower substrate(not shown), thereby to create an optical current in the transistor. Therefore, even when the transistor is in the off-state because the outside electrical source is not applied to the gate of the transistor, a current, i.e., off-current flows through the transistor. Accordingly, a life time of the transistor in the liquid crystal display device is shortened, and a contrast ratio, a gray and a flicker phenomenon, etc., of the liquid crystal display device are affected.

Thirdly, in the inversely staggered thin film transistor, because a gate electrode and are formed in one of the lower and the upper portions and source and drain electrodes are formed oppositely to the gate electrode, the gate electrode is overlapped with the source electrode and the drain electrode. This overlap results in the creation of a parasitic capacitance between the gate electrode and the source/drain electrodes. Such a parasitic capacitance creates a residual image in a picture of the liquid crystal display device and lowers a reliability thereof.

Fourth, so as to obtain the effective channel length, a width of the amorphous silicon layer 4 serving as the channel of the thin film transistor should be larger than a width of the gate electrode. To comply with such requirement, the size of the transistor become large. There is a problem that as the size of the transistor is bigger and bigger, the aperture ratio of the liquid crystal display device decreases less and less.

Fifth, the choice for the metal material of the gate electrode 2 is limited since the metal for the gate electrode should has the following properties: it must have a low resistance so as to shorten drive delay of the liquid crystal display device; it must be attacked by a tapered etching so as to improve the step coverage; and moreover, it should not be affected by the other processes after the formation of the gate electrode 2.

SUMMARY OF THE INVENTION

It is therefore an object of the present invention to provide a method of more simply manufacturing a transistor for a liquid crystal display device.

It is another object of the present invention to provide a transistor for a liquid crystal display device having low off-current.

It is still another object of the present invention to provide a transistor for a liquid crystal display device having a low parasitic capacitance between source/drain electrodes and a gate electrode.

It is still another object of the present invention to provide a transistor for a liquid crystal display device capable of improving the aperture ratio of the liquid crystal display device by possessing a size of the thin film transistor smaller than that of the prior art.

It is still another object of the present invention to provide a method of manufacturing a transistor for a liquid crystal display in which the selection margin of the metal material for the gate electrode is expanded.

To accomplish the above objects, the thin film transistor including source/drain electrodes, a channel and a gate electrode is designed to be arranged vertically relative to the substrate. Moreover, the electrode formed below the channel layer(which is hereinafter referred to as the lower electrode) is also designed to have the width larger than that of the channel layer and a non-transparent material is used for the electrode beneath the channel layer. Furthermore, the lower electrode and the gate electrode are designed such that the lower electrode of thin film transistor having a vertical structure is not overlapped with the gate electrode at the upper portion of the thin film transistor and is aligned with the gate electrode. Therefore, the parasitic capacitance between the gate electrode and the lower electrode, is eliminated.

A thin film transistor for a liquid crystal display device of an embodiment according to a spirit of the present invention comprising: a substrate; a first electrode formed on the surface of the substrate with a first width; a semiconductor layer formed on the first electrode with a second width not wider than the first width; an insulating material layer formed on the entire surface of the resultant substrate in which the semiconductor layer is formed, the insulating material layer having a contact hole exposing a portion of a surface of the semiconductor layer; a second electrode formed on a portion of the surface of the insulating material layer with filling the contact hole; and a gate electrode formed on other portion of the surface of the insulating material layer and also separated from the second electrode with a selected distance.

Here, the semiconductor layer is formed of an amorphous silicon material. The thin film transistor may further comprise a first ohmic layer formed between the first electrode and the semiconductor layer; a second ohmic layer formed between the semiconductor layer and the insulating layer; a first breakdown voltage controlling layer formed between the first ohmic layer and the semiconductor layer; and a second breakdown voltage controlling layer formed between the second ohmic layer and the semiconductor layer. Preferably, the first ohmic layer and the second ohmic layer are both formed of n+ amorphous silicon materials and having the equal impurity concentration to each other. The first breakdown voltage controlling layer and the second breakdown voltage controlling layer all are formed of a n− amorphous silicon material having lower impurity concentration than that of the first and second ohmic layers. The impurity concentration of the first breakdown voltage controlling layer is the same as that of the second breakdown voltage controlling layer. Furthermore, the first electrode is a source electrode and the second electrode is a drain electrode; and vice versa.

Moreover, the second electrode and the gate electrode are preferably formed of the same material as each other. The gate electrode may be aligned with the electrode making direct contact with the substrate, for example the source electrode.

In case that the first electrode is a drain electrode(or a source electrode), the gate electrode and the source electrode are formed of at least one material selected from the group consisting of aluminum, aluminum/molybdenum, molybdenum, and chromium and a combination thereof and the drain electrode(or source electrode) is formed of at least one material selected from the group consisting of aluminum, aluminum/molybdenum, molybdenum, chromium, molybdenum-tantalum(MoTa), molybdenum-tungsten(MoW) and a combination thereof.

In another embodiment of the thin film transistor according to the present invention, the gate electrode is designed to align with the source (or drain) electrode.

A liquid crystal display device according to a spirit of the present invention comprises a substrate; a first electrode formed with a first width on the substrate; a semiconductor layer formed on the first electrode and having a second width, the second width being narrower than the first width; an insulating layer formed on the entire surface of the resultant substrate in which the semiconductor layer is formed, the insulating layer having a contact hole exposing a portion of a surface of the semiconductor layer; a second electrode formed on a first selected portion of a surface of the insulating layer; and a pixel electrode formed on a second selected portion of the surface of the insulating layer, with filling the contact hole and expending to a portion of the surface of the second electrode; a gate electrode formed on a third selected portion of the surface of the insulating layer, and separated from the pixel electrode with a selected distance.

Here, one of the first electrode and the second electrode is a source electrode, and the other is a drain electrode. Also, like the embodiment described above with respect to the thin film transistor, the gate electrode may be aligned with the source electrode. In addition, the liquid crystal display device further may comprise passivation layer covering the pixel electrode and the gate electrode and a light shielding layer formed on the surface of the passivation layer.

A method of manufacturing a thin film transistor for a liquid crystal display device in an embodiment according to a spirit of the present invention comprises the steps of: (a) providing a substrate;(b) forming a first electrode on the substrate with a first width;(c) forming on the first electrode a semiconductor layer with a second width not wider than the first width; (d) forming an insulating material layer on the entire surface of the resultant substrate in which the semiconductor layer is formed, the insulating layer having a contact hole for exposing a portion of the surface of the semiconductor layer; (e) forming a second electrode on a portion of the surface of the insulating material layer with filling the contact hole; and (f) forming a gate electrode on other portion of the insulating layer, the gate electrode being separated from the second electrode with a selected distance.

Here, the semiconductor layer is formed of an amorphous silicon material. Moreover, the method may further comprise the steps of: forming a first ohmic layer between the first electrode and the semiconductor layer after the step(b), and forming a second ohmic layer between the semiconductor layer and the insulating layer after the step (c). Moreover, the method may further comprise the steps of: forming a first breakdown voltage controlling layer between the first ohmic layer and the semiconductor layer after the step(g), and forming a second breakdown voltage controlling layer after the formation of the second ohmic layer.

Here, the first ohmic layer and the second ohmic layer are formed of n+ amorphous silicon materials having the same impurity concentration as each other. The first and second breakdown voltage controlling layers all have an impurity concentration lower than that of the first and second ohmic layers. The first and second breakdown voltage controlling layers have the same impurity convention as each other.

Preferably, the step of forming the second electrode is performed simultaneously with the step of forming the gate electrode.

In a manufacturing method of the thin film transistor in another embodiment according to the present invention, the gate electrode is aligned with the source(or drain) electrode.

A method of manufacturing a liquid crystal display device according to a spirit of the present invention comprises the steps of:(a) providing a substrate; (b) forming a first electrode on the substrate with a first width;(c) forming a semiconductor layer with a second width not wider than the first width, on the surface of the first electrode;(d) forming an insulating layer on the resultant substrate in which the semiconductor layer is formed, the insulating layer having a contact hole for exposing a portion of the surface of the semiconductor layer;(e) forming a second electrode on a first selected portion of the surface of the insulating layer;(f) forming a pixel electrode extending from a second selected portion of the surface of the insulating layer to a portion of the surface of the second electrode so as to fill the contact hole; and (g) forming a gate electrode on another portion of the surface of the insulating layer, the gate electrode being separated from the pixel electrode with a selected distance.

Here, one of the first electrode and the second electrode is a source electrode, and the other is a drain electrode. Like the embodiment described above with respect to the manufacture of the thin film transistor, the gate electrode may be aligned with the underlying source(or drain) electrode.

Moreover, the method further comprises the steps of (g) forming a passivation film covering the pixel electrode and the gate electrode after the step (f), and (h) forming a light shielding layer on the entire surface of the passivation film after the step (g).

As the width of the electrode underlying the channel layer is wider than the width of the channel layer, the light being incident from a backlight unit is absorbed by the electrode underlying the channel layer, thus to decrease a optical current of the channel layer. Accordingly, off-current will not flow through the transistor. Also, the aperture of the thin film transistor ratio will increase as the thin film transistor is designed to be smaller than in the prior art. As the electrode underlying the channel layer, for example a source electrode and a gate electrode are designed such that they do not overlap with each other, a parasitic capacitance does not occur at the portion between the electrode and the gate electrode. The above objects, advantages, and other objects and features in accordance with the present invention will be described with the reference to the drawings.

DESCRIPTION OF THE PREFERRED EMBODIMENT

Figure 1:
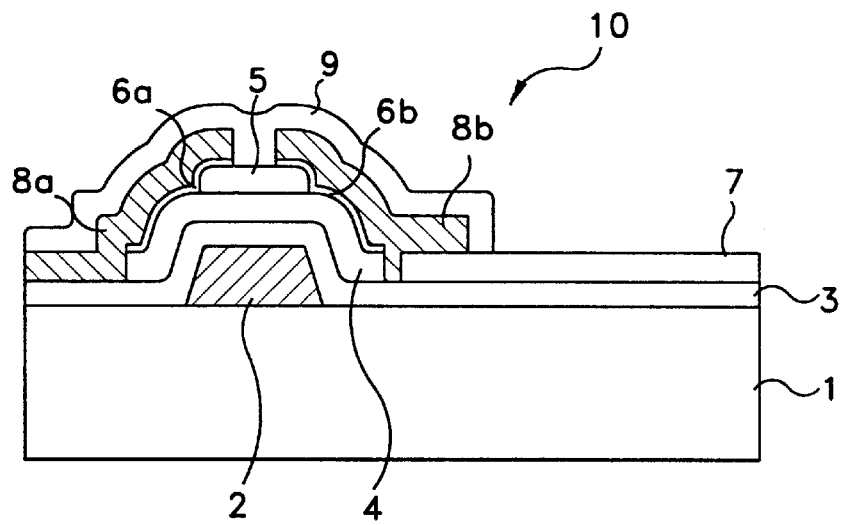
FIG. 1 is a cross sectional view of an inversely staggered type thin film transistor for a liquid crystal display device according to the prior art.
Figure 2A:
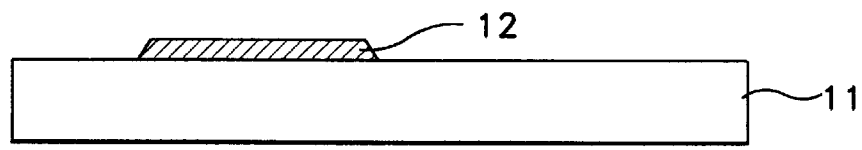
FIGS. 2a to 2e are cross-sectional views showing steps for manufacturing a thin film transistor of a liquid crystal display device according to the present invention.

Hereinafter, embodiments of the invention regarding a liquid crystal display device including a thin film transistor and a method of manufacturing the same will be in detail described with reference to the drawings:

Referring to FIG. 2a, a non-transparent conductive material is deposited to a thickness of about 2000 to 5000 Å on the top surface of a substrate 11 and is patterned using a first mask to form a drain electrode 12. Here, the conductive material is at least one selected from a group of consisting of aluminum, aluminum alloy, aluminum/molybdenum, chromium, molybdenum-tantalum(MoTa), molybdenum-tungsten(MoW) and a combination thereof. At this time, a data line of a liquid crystal display device (not shown) is formed simultaneously with the drain electrode 12.

Figure 2B:
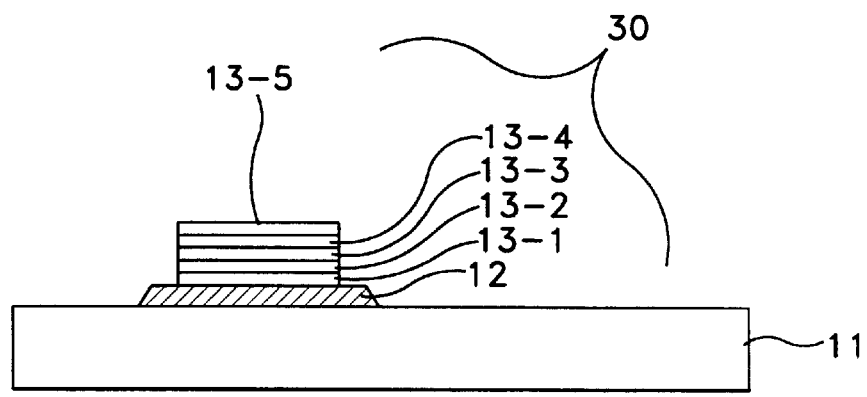

Generally, a drain electrode is a portion protruded from the date line and is formed integrally with the date line. Then, on the drain electrode 12 are sequentially deposited a first high concentration-impurity layer, a first low concentration-impurity layer, a semiconductor layer, a second low concentration-impurity layer, and a second high concentration-impurity layer. Successively, after a second mask pattern is formed over the surface of the second high concentration impurity layer, these layers deposited on the drain electrode 12 are simultaneously patterned to form a first high concentration impurity layer 13-1, a first low concentration impurity layer 13-2, a semiconductor layer 13-3, a second low concentration impurity layer 13-4, and a second high concentration impurity layer 13-5. In this embodiment, these multi-layered structure is indicated as a channel layer 30 as shown in FIG. 2b. The channel layer 30 has a width narrower than that of the drain electrode 12. Also, the drain electrode 12 is made of non-transparent metal. Accordingly, as a substantial dose of light incident on the drain electrode from a backlight unit is absorbed into the drain electrode, and it is thereby prevented that the light reaches the channel layer 30.

The semiconductor layer 13-3 only can sufficiently serve as a channel of a thin film transistor. However, so as to improve the characteristic of the thin film transistor, the high concentration impurity layers 13-1 and 13-5 and the low concentration impurity regions 13-2 and 13-4 are additionally included in the channel layer 30. To provide good ohmic contacts between the drain electrode 12 and a source electrode 17 to be formed later, the first high concentration impurity layer 13-1 and the second high concentration-impurity layer 13-5 respectively are included in the channel layer 30. These high concentration impurity layers 13-1 and 13-5 all are formed of N type amorphous silicon material (n+ a-SiH). The first high concentration impurity layer 13-1 and the second high concentration impurity layer 13-5 have the same concentration of impurity as each other.

To control a breakdown voltage of a thin film transistor, the first and second low concentration impurity layers 13-2 and 13-4 are included in the channel layer 30. They have the same impurity concentration as each other and are formed of N type amorphous silicon material (n− a-Si:H). Though an extrinsic semiconductor is generally used for the semiconductor layer 13-3, an amorphous silicon (a-Si:H) is used in this embodiment because a high temperature process is not required in forming the amorphous silicon.

Figure 2C:
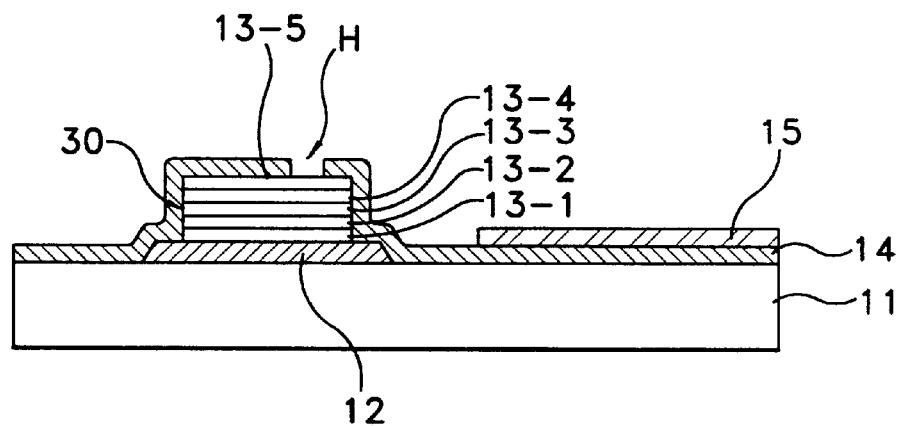

Following the formation of the channel layer 30, as shown in FIG. 2c, a gate insulating material is deposited on the entire structure of the resultant surface. Here, the gate insulating material is formed of one material selected from the group consisting of silicon oxide, a silicon nitride, and silicon nitrogen-oxide. Alternatively, the gate insulating material may be formed of a multi-layered structure. The gate insulating material is etched at a portion thereof overlying the channel layer 30 using a third mask pattern, to form a gate insulating layer 14 having a contact hole H. Here, the contact hole H is used for electrically connecting the channel layer 30 with a source electrode 17 to be formed in a further step. Successively, a transparent metal such as indium tin oxide is deposited on the entire surface of the gate insulating layer 14 for the gate and is patterned using fourth mask pattern such that a pixel electrode 15 separated from the channel layer 30 is formed.

In the above, the gate insulating layer is deposited and the contact hole H is then directly formed. However, the contact hole H may be also formed after the formation of the gate insulating layer and the pixel electrode.

Figure 2D:
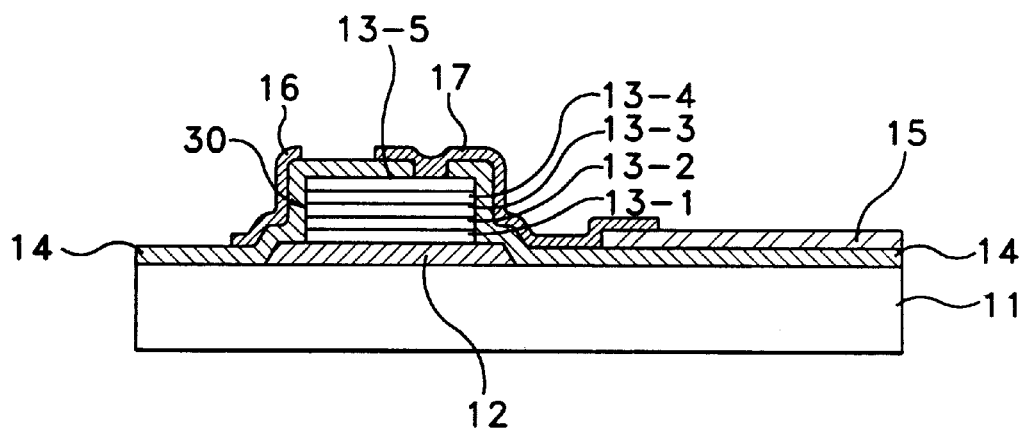

Referring to FIG. 2d, a metal material is deposited to a selected thickness on a portion of the gate insulating layer and a portion of the pixel electrode 15. At this time, the contact hole is filled with the metal material. Here, the metal material is at least one selected form the group consist of aluminum, aluminum/molybdenum, molybdenum, and chromium and a combination thereof. As shown in FIG. 2d, the metal film is patterned using a fifth mask pattern to simultaneously form a source electrode 17 extending from a top surface of the gate insulating layer having the contact hole (H) to a portion of the surface of the pixel electrode 15 and a gate electrode 16 separated with a selected distance from the source electrode 17 and extending with a selected distance in the opposite side to the pixel electrode 15. Here, since the drain electrode 12 is formed on the surface of the substrate 11, and the source electrode 17 and the gate electrode 16 are separated from each other, a parasitic capacitance which has been occurred vertically between a gate electrode and a source electrode in an inversely staggered type thin film transistor in the prior art is eliminated.

Figure 3:
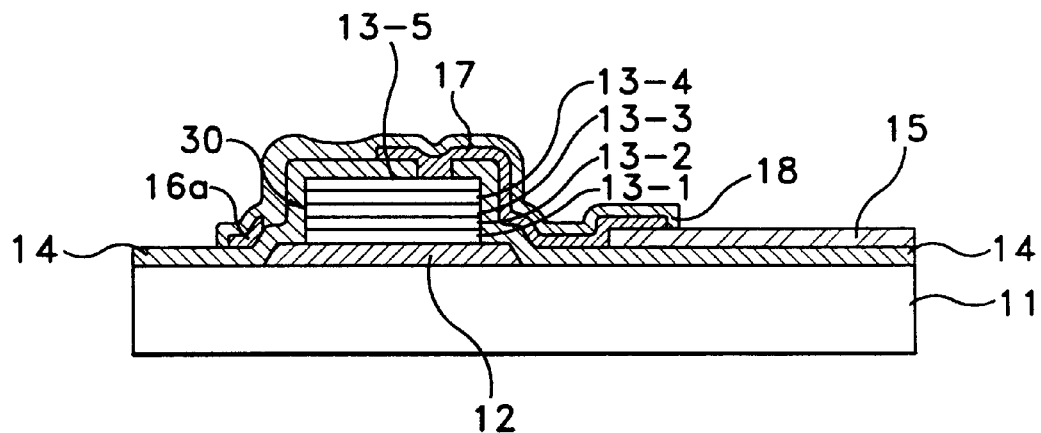
FIG. 3 is a cross-sectional view showing a thin film transistor for a liquid crystal display device according to another embodiment of the present invention.

Alternatively, as shown in FIG. 3, the gate electrode 16a may be aligned with the drain electrode 12. In this case, as there is no overlapping portion between the drain electrode 12 and the gate electrode 16a, a parasitic capacitance therebetween does not occur. To align the drain electrode with the gate electrode is accomplished by modifying a shape of the mask pattern used in the step of the formation of the gate electrode.

A thin film transistor formed in such a manner has a vertical structure in which the source electrode 17 and the drain electrode 12 respectively are located in the upper and lower positions with the channel layer interposed between them. Therefore, when the external voltage is applied to the gate electrode 16 via a gate line, the signal is transferred to the source electrode 17 via the channel layer 30, and the pixel electrode 15 connected to the source electrode 17 is driven by the signal. Moreover, as the channel length of the thin film transistor is determined by the thickness of the semiconductor layer 13-3, the reduction of the semiconductor layer 13-3 in length is more easy. Thus, the size of the thin film transistor may be reduced, compared with that of the prior art thin film transistor. Accordingly, the liquid crystal display device having the structure of a vertical thin film transistor according to the present invention can have high aperture ratio, compared with the liquid crystal display device having a thin film transistor of relatively large size in the prior art. In addition, as the gate electrode is formed at upper part of the thin film transistor unlike in the prior art, a stress of the gate electrode film is relatively decreased, whereby the selection margin of metal for a gate electrode will become increased.

Figure 2E:
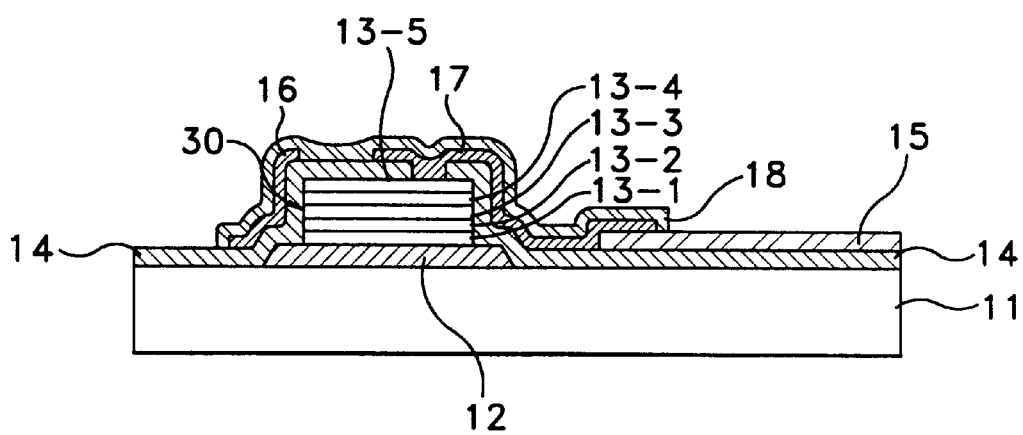

Referring to FIG. 2e, to protect the thin film transistor, either a silicon oxide film or a silicon nitride film is deposited and is patterned using a sixth mask to form a passivation film 18 such that either the silicon oxide or the silicon nitride remains at only a portion on which a thin film transistor is formed.

In the step of manufacturing the inversely staggered thin film transistor, seven or eight masks are required in the prior art whereas six masks are required in the present invention. Therefore, the manufacturing process in the present invention is still more simplified.

Figure 4:
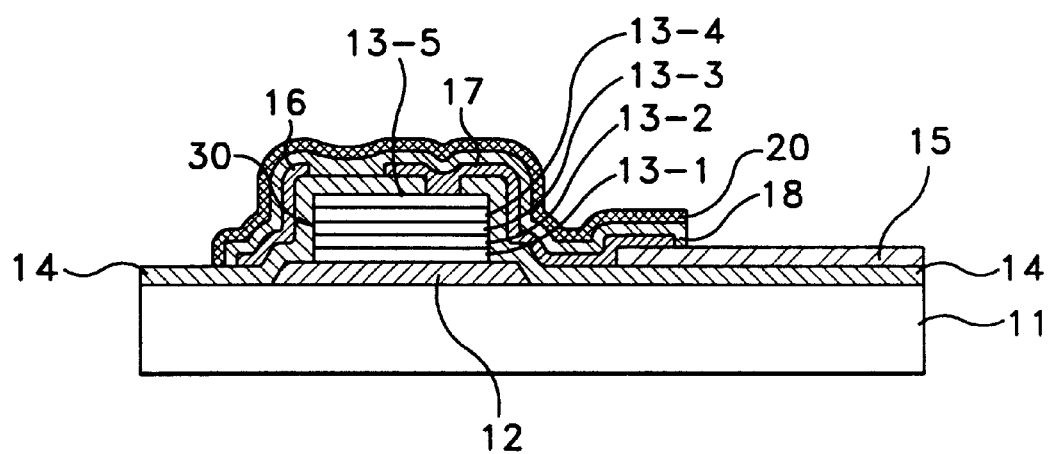
FIG. 4 is a cross-sectional view showing a thin film transistor of a liquid crystal display device according to a still another embodiment of the present invention.

The liquid crystal display device of FIG. 4 further comprises the light shielding layer 20 on the surface of the passivation layer formed on the surface of the thin film transistor, for preventing a thin film transistor from deteriorating due to the light leakage.

After the formation of the thin film transistor, insulating layer such as the silicon oxide or silicon nitride is deposited on the surface of the thin film transistor.

Successively, an opaque metal layer is deposited. Next, the insulating layer and the opaque metal layer are both etched using a mask pattern, simultaneously forming the passivation layer 18 and the light shielding layer 20.

Alternatively, it is possible that after the passivation film is formed and is then patterned, a light shielding layer is formed and is then patterned.

As described above, the method of manufacturing a thin film transistor having a vertical structure according to the present invention is simple, compared with that of manufacturing an inversely staggered thin film transistor having an etch stopper in the prior art. Moreover, as the size of the thin film transistor may be reduced, the aperture ratio of the liquid crystal display device employing such a thin film transistor can be increased. As optical current of the channel layer owing to light incident from the backlight unit is blocked, the lifetime of the thin film transistor may increase. As the parasitic capacitance between the gate electrode and the source/drain electrodes decreases, the characteristic deterioration of the liquid crystal display device employing the thin film transistor according to the present invention will be prevented. Moreover, since the gate electrode 16 is formed after the formation of the drain electrode 12(or the source electrode), the stress of the gate electrode to be formed later will be relatively decreased, thereby to increase the selectivity of metal for the gate electrode.

While the present invention has been particularly shown and described with reference to particular embodiments thereof, it will be understood by those skilled in the art that various changes in form and details may be effected therein without departing from the spirit and scope of the prevent invention as defined by the appended claims.

What is claimed is:

1. A thin film transistor for a liquid crystal display device comprising:

a substrate;

a first electrode formed on the substrate, with a first width;

a semiconductor layer formed on the first electrode having a second width, the second width being narrower than the first width;

an insulating layer formed on an entire surface of a resultant structure in which the semiconductor layer is formed, the insulating layer having a contact hole for exposing a portion of a surface of the semiconductor layer;

a second electrode formed on a portion of a surface of the insulating layer, and filling the contact hole; and a gate electrode formed on another portion of the surface of the insulating layer, and separated from the second electrode with a selected distance.

2. The thin film transistor for a liquid crystal display device according to claim 1, wherein the semiconductor layer is of an amorphous silicon material.

3. The thin film transistor for a liquid crystal display device according to claim 1, further comprising a first ohmic layer formed between the first electrode and the semiconductor layer, and a second ohmic layer formed between the semiconductor layer and the insulating layer.

4. The thin film transistor for a liquid crystal display device according to claim 3, wherein the first ohmic layer and the second ohmic layer all are of a n+ amorphous silicon and have equal impurity concentration to each other.

5. The thin film transistor for a liquid crystal display device according to claim 3, further comprising: a first breakdown voltage controlling layer formed between the first ohmic layer and the semiconductor layer; and a second breakdown voltage controlling layer formed between the second ohmic layer and the semiconductor layer.

6. The thin film transistor for a liquid crystal display device according to claim 5, wherein the first breakdown voltage controlling layer and the second breakdown voltage controlling layer both have equal impurity concentration to each other and are of n− amorphous silicon, the impurity concentration of the first and second breakdown voltage controlling layers being lower than that of the first and second ohmic layers.

7. The thin film transistor for a liquid crystal display device according to claim 1, wherein one of the first electrode and second electrode is a source electrode and the other is a drain electrode.

8. The thin film transistor for a liquid crystal display device according to claim 1, wherein the second electrode and the gate electrode all are of the same material as each other.

9. The thin film transistor for a liquid crystal display device according to claim 1, wherein the gate electrode is aligned with the first electrode.

10. The thin film transistor for a liquid crystal display device according to claim 9, wherein one of the first electrode and second electrode is a source electrode and the other is a drain electrode.

11. The thin film transistor for a liquid crystal display device according to claim 1, wherein the gate electrode is of at least one selected from the group consisting of aluminum, aluminum/molybdenum, molybdenum, and chromium and a combination thereof.

12. The thin film transistor for a liquid crystal display device according to claim 1, wherein the first electrode is of at least one selected from the group consisting of aluminum, aluminum/molybdenum, molybdenum, chromium, molybdenum-tantalum, and molybdenum-tungsten and a combination thereof.

13. A liquid crystal display device comprising:

a substrate;

a first electrode formed on the substrate, with a first width;

a semiconductor layer formed on the first electrode having a second width, the second width being narrower than the first width;

an insulating layer formed on an entire of the surface of a resultant structure in which the semiconductor layer is formed, the insulating layer having a contact hole for exposing a portion of a surface of the semiconductor layer;

a second electrode formed on a first selected portion of a surface of the insulating layer, and filling the contact hole; and a pixel electrode formed on a second selected portion of the insulating layer, and extended to a portion of the surface of the second electrode; and a gate electrode formed on a third selected portion of the surface of the insulating layer, and separated from the pixel electrode with a selected distance.

14. The liquid crystal display device according to claim 13, wherein one of the first electrode and the second electrode is a source electrode, and the other is a drain electrode.

15. The liquid crystal display device according to claim 14, wherein the gate electrode is aligned with the source electrode.

16. The liquid crystal display device according to claim 13, further comprising a passivation layer covering the pixel electrode and the gate electrode and a light shielding layer formed on the surface of the passivation layer.

17. A method of manufacturing a thin film transistor for a liquid crystal display device comprising the steps of:

(a) providing a substrate;

(b) forming a first electrode with a first width on the substrate;

(c) forming a semiconductor layer on the first electrode with a second width narrower than the first width;

(d) forming an insulating layer on a surface of a resultant structure in which the semiconductor layer is formed, such that a portion of a surface of the semiconductor layer is exposed to form a contact hole;

(e) forming a second electrode on a portion of a surface of the insulating layer with the contact hole filled; and (f) forming a gate electrode on another portion of the surface of the insulating layer such that the gate electrode is separated with a selected distance from the second selected electrode.

18. The method of manufacturing a thin film transistor for a liquid crystal display device according to claim 17, wherein the semiconductor layer is formed of an amorphous silicon.

19. The method of manufacturing a thin film transistor for a liquid crystal display device according to claim 17, further comprising the steps of: (g) forming a first ohmic layer between the first electrode and the semiconductor layer after the step (b), and (h) forming a second ohmic layer between the semiconductor layer and the insulating layer after the step (c).

20. The method of manufacturing a thin film transistor for a liquid crystal display device according to claim 19, wherein the first ohmic layer and the second ohmic layer all are formed of n+ amorphous silicon and have the same impurity concentration as each other.

21. The method of manufacturing a thin film transistor for a liquid crystal display device according to claim 19, further comprising the steps of: (i) forming a first breakdown voltage controlling layer between the first ohmic layer and the semiconductor layer after the step (g) and (j) forming a second breakdown voltage controlling layer between the second ohmic layer and the semiconductor layer after the step (h).

22. The method of manufacturing a thin film transistor for a liquid crystal display device according to claim 21, wherein the first breakdown voltage controlling layer and the second breakdown voltage controlling layer all are formed of n− amorphous silicon having an impurity concentration lower than that of the first ohmic layer and the second ohmic layer, the impurity concentration of the first and second breakdown voltage controlling layers being equal to each other.

23. The method of manufacturing a thin film transistor for a liquid crystal display device according to claim 17, wherein one of the first electrode and the second electrode is a source electrode and the other is a drain electrode.

24. The method of manufacturing a thin film transistor for a liquid crystal display device according to claim 17, wherein the second electrode and the gate electrode all are formed of the same material as each other.

25. The method of manufacturing a thin film transistor for a liquid crystal display device according to claim 17, wherein the gate electrode is aligned with the first electrode.

26. The method of manufacturing a thin film transistor for a liquid crystal display device according to claim 17, wherein the gate electrode is formed of at least one selected from the group consisting of aluminum, aluminum/molybdenum, molybdenum, and chromium and a combination thereof.

27. The method of manufacturing a thin film transistor for a liquid crystal display device according to claim 17, wherein the first electrode is formed of at least one selected from the group consisting of aluminum, aluminum/molybdenum, molybdenum, chromium, molybdenum-tantalum, and molybdenum-tungsten and a combination thereof.

28. The method of manufacturing a thin film transistor for a liquid crystal display device according to claim 17, wherein the step (e) and the step (f) are performed simultaneously.

29. A method of manufacturing a liquid crystal display device comprising the steps of:
  (a) providing a substrate;
  (b) forming a first electrode with a first width on the substrate;
  (c) forming a semiconductor layer on the first electrode with a second width narrower than the first width;
  (d) forming an insulating layer with a contact hole on a surface of a resultant structure in which the semiconductor layer is formed such that a portion of a surface of the semiconductor layer is exposed;
  (e) forming a second electrode on a first selected portion of the surface of the insulating layer, and filling the contact hole;
  (f) forming a pixel electrode extending from a second selected portion of the surface of the insulating layer to a portion of a surface of the second electrode; and
  (g) forming a gate electrode on a third selected portion of the surface of the insulating layer, the gate electrode being separated from the pixel electrode.

30. A method of manufacturing a liquid crystal display device according to claim 29, wherein one of the first electrode and the second electrode is a source and the other is drain electrode.

31. The method of manufacturing a liquid crystal display device according to claim 29, wherein the gate electrode is aligned with the first electrode.

32. The method of manufacturing a liquid crystal display device according to claim 29, further comprising the steps of:
  (h) forming a passivation layer for covering the pixel electrode and the gate electrode after the step (g); and
  (i) forming a light shielding layer on an entire surface of the passivation layer after the step (h).

* * * * *